United States Patent [19]
Smith et al.

[11] Patent Number: 5,989,718
[45] Date of Patent: Nov. 23, 1999

[54] DIELECTRIC DIFFUSION BARRIER

[75] Inventors: Keith W. Smith; Charles E. Carver, both of Boise; Clarence J. Higdon, Meridian, all of Id.

[73] Assignee: Micron Technology, Boise, Id.

[21] Appl. No.: 08/936,676

[22] Filed: Sep. 24, 1997

[51] Int. Cl.$^6$ ...................................................... B32B 9/04
[52] U.S. Cl. ........................ 428/446; 428/701; 428/702; 428/144; 428/255; 428/457; 438/255
[58] Field of Search ..................................... 428/446, 701, 428/702, 144, 255, 457; 438/255

[56] References Cited

U.S. PATENT DOCUMENTS

| | | | |
|---|---|---|---|
| 4,943,538 | 7/1990 | Mohsen et al. | 437/52 |
| 5,168,072 | 12/1992 | Moslehi | 437/41 |
| 5,326,722 | 7/1994 | Huang | 437/186 |
| 5,601,656 | 2/1997 | Li | 134/2 |

*Primary Examiner*—Timothy Speer
*Assistant Examiner*—Bryant Young
*Attorney, Agent, or Firm*—Workman, Nydegger & Seeley

[57] ABSTRACT

Disclosed is a process for forming, over a semiconductor substrate, a multilayer structure having successively a first layer of silicon-containing material, a relatively thin oxide layer, and a second layer of silicon-containing material. The oxide layer has a substantially uniform thickness in a range from about 1 Angstrom to about 20 Angstroms. The oxide layer consists essentially of silicon dioxide that is formed by exposing the first layer to an aqueous oxidizing bath at a relatively low temperature such that diffusion of dopants in the semiconductor substrate is not induced. The oxide layer prevents dopants from outgassing and diffusing out of the first layer and into the second layer. Also disclosed is a structure formed by the disclosed process.

22 Claims, 2 Drawing Sheets

DIELECTRIC DIFFUSION BARRIER

BACKGROUND OF THE INVENTION

1. The Field of the Invention

The present invention relates to methods of forming a silicon-containing structure over a semiconductor substrate. More particularly, the present invention relates to a method of forming a multilayer structure having successively a first layer of silicon-containing material, a relatively thin layer of silicon dioxide, and a second layer of silicon-containing material.

2. The Relevant Technology

Integrated circuits are currently manufactured by an elaborate process in which semiconductor devices, insulating films, and patterned conducting films are sequentially constructed in a predetermined arrangement on a semiconductor substrate. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. The conventional semiconductor devices which are formed on the semiconductor wafer include capacitors, resistors, transistors, diodes, and the like. In advanced manufacturing of integrated circuits, hundreds of thousands of these semiconductor devices are formed on a single semiconductor substrate.

Integrated circuit manufacturing often requires formation of one layer of silicon-containing material over another layer of silicon-containing material. For convenience, an underlying silicon-containing layer will be referred to hereinafter as the first layer and an overlying silicon-containing layer will be referred to as the second layer. Frequently, the properties of a first layer will differ from those of a second layer in one or more important ways. For instance, the two layers may have different concentrations of dopants, thereby giving each layer different electrically conductive properties. The two layers may also have different crystalline structures, such as monocrystalline, polycrystalline, amorphous, cylindrical grain polysilicon, hemispherical grain, and spherical grain.

It is well understood that grain boundaries in highly doped, highly crystalline polysilicon facilitate outgassing and migration of dopants. It is surmised that diffusion of dopants is especially problematic when the dopants move into an adjacent second layer of silicon-containing material, thereby creating nonuniformities in the second layer. For example, a sheet resistance measurement taken at any particular point on the second layer may significantly depart from the average sheet resistance of the second layer. Dopant diffusion into adjacent layers may also cause a structure that contains layers having nonuniform thickness.

It has been found that a silicon dioxide layer formed on the surface of a highly doped, highly crystalline polysilicon layer acts as diffusion barrier against outgassing of dopants. However, a layer of silicon dioxide can have undesirable consequences on a structure in which it is used. Techniques for forming a layer of silicon dioxide typically involve exposing a silicon layer to a thermal oxidation process, thereby heating not only the surface of the polysilicon layer, but also the semiconductor surface on which it lies. This heating sometimes induces diffusion of dopant material from active regions in the semiconductor substrate into adjacent previously undoped regions. Enlargement of active regions can cause inefficiency or failure of semiconductor devices. Moreover, conventional methods of forming silicon dioxide diffusion barriers produce silicon dioxide layers sufficiently thick to impair the conductivity of structures in which they are used.

What is needed is a method of forming an oxide layer upon a layer of doped silicon-containing material that adequately prevents diffusion and outgassing of dopants. A method is needed for forming an oxide layer sufficiently thin so as to not significantly reduce the conductivity of the structure in which it is used. It would also be advantageous to provide a method for forming an oxide layer that does not inherently expose nearby active regions of a semiconductor substrate to high temperatures.

SUMMARY OF THE INVENTION

The present invention relates to a process for forming a multilayer structure having successively a first layer of silicon-containing material, a relatively thin layer of silicon dioxide, and a second layer of silicon-containing material. Each of the first layer and the second layer of silicon-containing material is substantially composed of materials selected from the group consisting of monocrystalline silicon, polysilicon, amorphous silicon, spherical grain (BSG) polysilicon, and hemispherical grain (HSG) polysilicon. The oxide layer has a substantially uniform thickness in a range from about 1 Angstrom to about 20 Angstroms and consists essentially of silicon dioxide.

In one embodiment of the process, a first layer is formed over a semiconductor substrate. The first layer contains dopants, preferably in a high concentration in a range from about $5 \times 10^{19}$ atoms/cm$^3$ to about $1 \times 10^{21}$ atoms/cm$^3$. An oxidation process is conducted on the first layer to form an oxide layer having a thickness between about 1 Angstrom and about 20 Angstroms. The preferred oxidation process uses an aqueous bath with an oxidizing agent bubbled therethrough. The aqueous bath preferably has a temperature in a range from about 0° C. to about 200° C. Finally, a second layer of silicon-containing material is formed upon the oxide layer. The oxide layer substantially prevents diffusion of dopants out of the first layer and into the second layer. It is surmised that the second layer is thereby protected from dopants that would otherwise diffuse thereinto and cause nonconformities of various properties, including sheet resistivity and thickness. Preferably, the first layer, the oxide layer, and the second layer form a laminate having an average sheet resistance and having a plurality of points thereon, where the sheet resistance at each point is within 10% of said average sheet resistance. Alternatively, it is preferable that the second layer has a plurality of points thereon and has an average thickness, where the thickness at each point on the second layer is within 7% of the average thickness of the second layer.

In a second application of the invention, a first layer of silicon-containing material is positioned over a semiconductor substrate. A contact opening is cut through the first layer to extend to a contact surface on the semiconductor substrate. The first layer has an exposed surface including both of a sidewall that partially defines the contact opening and a top surface. An oxidation process is used to form an oxide layer on the exposed surface of the first layer. A second layer of silicon-containing material is formed upon the oxide layer, extending into the contact opening and to the contact surface. Again, the oxide layer substantially prevents diffusion of dopants out of the first layer and into the second layer.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are therefore not to be considered limiting of its scope, the invention will be described with additional specificity and detail through the use of the accompanying drawings in which.

DETAILED DESCRIPTION OF THE PREFERRED EMBODIMENTS

Figure 1:
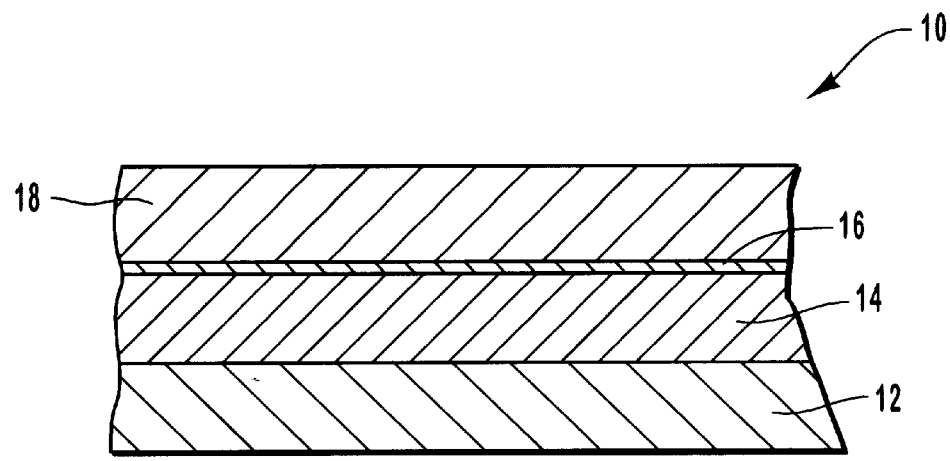
FIG. 1 is a partial cross-section elevation view of a structure having a thin oxide layer positioned between two silicon-containing layers.
Figure 2:
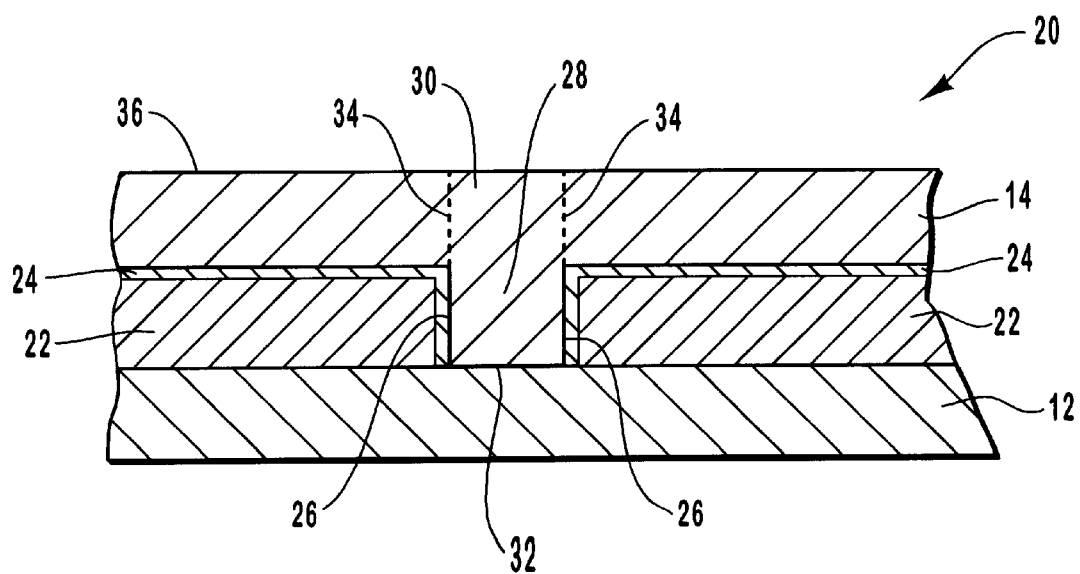
FIG. 2 is a partial cross-section elevation view of a structure having a first layer of silicon-containing material positioned over an electrically conductive layer and an electrically insulative layer.
Figure 3:
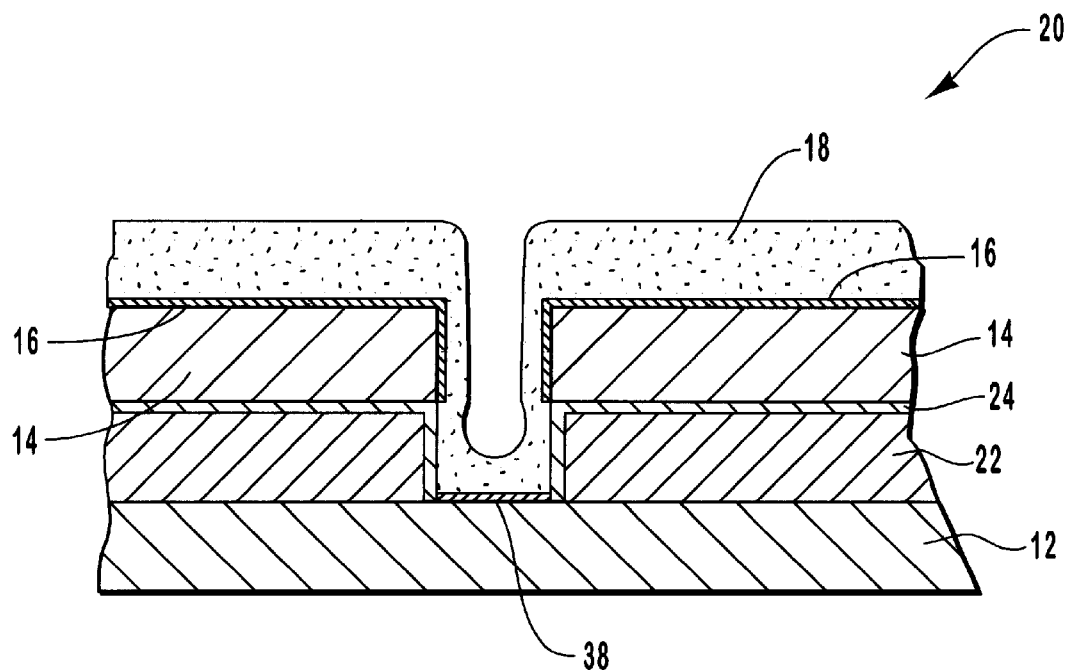
FIG. 3 is a partial cross-section elevation view of a structure of FIG. 2, further having an oxide layer, a contact opening extending to a semiconductor substrate, and a second layer of silicon-containing material.

The present invention relates to a process for forming a multilayer structure having successively a first layer of silicon-containing material, a relatively thin layer of silicon dioxide, and a second layer of silicon-containing material. FIG. 1 shows one application of the inventive process in which a structure is formed that has a thin silicon dioxide layer that substantially prevents diffusion and outgassing of dopants therethrough from a highly doped, highly crystalline polysilicon layer. FIGS. 2 and 3 illustrate another application which involves forming a structure having a thin layer of silicon dioxide disposed between two layers of silicon-containing material. The second layer extends into a contact opening that passes through the first layer. Again, the silicon dioxide layer substantially prevents diffusion and outgassing of dopants from the first layer into the second layer, as well as from the second layer through the first layer.

FIG. 1 illustrates a structure 10 having a first layer 14 of silicon-containing material that is formed over a semiconductor substrate 12. Semiconductor substrate 12 comprises a semiconductive material either alone or in an assembly comprising other materials including but not limited to monocrystalline silicon, silicon on sapphire, silicon on glass, and silicon on insulator. The silicon-containing material of first layer 14 preferably consists essentially of elemental silicon. First layer 14 may be silicon of any crystalline structure, including, but not limited to amorphous, monocrystalline, polycrystalline, HSG, and CSG silicon. The method according to the invention is particularly advantageous when first layer 14 contains a highly doped, highly crystalline polysilicon material. For purposes of the invention, a highly doped silicon material is one having a dopant concentration in a range from about $5 \times 10^{19}$ atoms/$cm^3$ to about $1 \times 10^{21}$ atoms/$cm^3$. However, the first layer may be doped at a concentration greater or less than the above-specified range, and may be substantially undoped.

An oxide layer 16, having a thickness in a range between 1 Angstrom and 20 Angstroms is formed upon first layer 14. In the preferred embodiment of the invention, oxide layer 16 has a thickness of from about one to about nine molecules of silicon dioxide. Oxide layer 16 is formed preferably in an oxidizing process. By way of example, an oxidizing agent can be bubbled through an aqueous bath into which first layer 14 is submerged. Other oxidizing processes are contemplated, as well as other oxidizing agents including diatomic oxygen, ozone, and hydrogen peroxide. The oxidizing agent may also be any other reagent that induces formation of silicon dioxide on a silicon surface at temperatures less than 200° C. Oxide layer 16 is relatively uniform in that it covers and conforms to the surface of first layer 14 in an essentially unbroken layer.

A second layer 18 of silicon-containing material is next formed upon oxide layer 16. The silicon-containing material of second layer 18 preferably consists essentially of elemental silicon. Second layer 18 may be silicon of any crystalline structure, including, but not limited to monocrystalline, polycrystalline, amorphous, cylindrical grain polysilicon, hemispherical grain, and spherical grain.

In structure 10, oxide layer 16 is positioned between first layer 14 and second layer 18 such that it forms a barrier against diffusion and outgassing therethrough of any dopants contained in first and second layers 14, 18. Oxide layer 16 thereby substantially prevents influx of dopants into second layer 18 from first layer 14. Oxide layer 16 likewise forms a barrier against diffusion of dopants out of second layer 18 and into first layer 14.

In one variation of the embodiment illustrated in FIG. 1, semiconductor substrate 14 contains doped active regions (not shown) and undoped regions (not shown) As oxide layer 16 is formed, temperatures to which structure 10 is exposed are sufficiently low so as not to induce a diffusion of dopants from the doped active regions into the undoped regions of the semiconductor substrate.

FIG. 2 illustrates another preferred embodiment in which a structure 20 is formed over semiconductor substrate 12. An electrically conductive layer 22 preferably composed of materials such as refractory metal silicides, silicon containing semiconductor materials, GaAr containing semiconductor materials, and silicon containing materials having a structure that is monocrystalline, polycrystalline, amorphous, cylindrical grain polysilicon, hemispherical grain, and spherical grain. Electrically conductive layer 22 is formed over semiconductor substrate 12. An electrically insulative layer 24 is provided upon electrically conductive layer 22. Preferably, electrically insulative layer 24 comprises silicon dioxide, but may alternatively comprise silicon nitride or another suitable insulative material. Next, first layer 14 of silicon-containing material is positioned over electrically insulative layer 24 and preferably extends into a pattern 26 provided through electrically conductive layer 22. Alternatively, electrically conductive layer 22 and electrically insulative layer 24 may be omitted from structure 20, in which case first layer 14 is formed directly upon semiconductor substrate 12.

Silicon-containing material of first layer 14 is selectively removed by known means from region 30 (shown in phantom) that is substantially vertically aligned with pattern 26, thereby forming a contact opening 28 in first layer 14 and extending through pattern 26 to a contact surface 32 on semiconductor substrate 12. Contact opening 28 is defined by a sidewall 34 of first layer 14, pattern 26, and contact surface 32.

Referring to FIG. 3, oxide layer 16 having a thickness in a range from about 1 Angstrom and about 20 Angstroms is formed upon sidewall 34 and top surface 36 of first layer 14. Oxide layer 16 consists of silicon dioxide formed preferably in the oxidizing process described above with respect to FIG. 1. The oxidation process also forms a contact silicon dioxide layer 38 upon contact surface 32.

A second layer 18 of silicon-containing material is formed upon oxide layer 16. Second layer 18 is configured such that it extends into contact opening 28 and is disposed upon contact silicon dioxide layer 38. Oxide layer 16 is positioned between first layer 14 and second layer 18 such that it forms a barrier against diffusion and outgassing of any dopants contained in first layer 14. Oxide layer 16 thereby substantially prevents influx of dopants into second layer 18 from first layer 14. Oxide layer 16 likewise forms a barrier against diffusion of dopants out of second layer 18 and into first layer 14.

The present invention has application to methods of forming a wide variety of structures other than those specifically described herein. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A structure formed over a semiconductor substrate comprising:
    a first layer of silicon-containing material positioned over said semiconductor substrate;
    a silicon dioxide layer formed upon said first layer of silicon-containing material, said silicon dioxide layer having a thickness of about 3 Angstroms; and
    a second layer of silicon-containing material positioned upon said silicon dioxide layer.

2. A structure as recited in claim 1, wherein said first layer of silicon-containing material is substantially composed of a material selected from the group consisting of monocrystalline silicon, polysilicon, hemispherical grain silicon, spherical grain silicon, and amorphous silicon.

3. A structure as recited in claim 1, wherein said second layer of silicon-containing material is substantially composed of a material selected from the group consisting of monocrystalline silicon, polysilicon, hemispherical grain silicon, spherical grain silicon, and amorphous silicon.

4. A structure as recited in claim 1, wherein said first layer of silicon-containing material is doped with dopants at a concentration in a range from about $5 \times 10^{19}$ atoms/cm$^3$ to about $1 \times 10^{21}$ atoms/cm$^3$.

5. A structure as recited in claim 1, wherein said first layer of silicon-containing material, said silicon dioxide layer, and said second layer of silicon-containing material form a laminate having an average sheet resistance and having a plurality of points the sheet resistance of which is within 10% of said average sheet resistance.

6. A structure as recited in claim 1, wherein said second layer of silicon-containing material has an average thickness and a has a plurality of points, wherein the thickness of the second layer of silicon-containing material at each said point is within 7% of the average thickness of said second layer of silicon-containing material.

7. A structure comprising:
    a monocrystalline silicon layer;
    a silicon dioxide layer formed upon said monocrystalline silicon layer, said silicon dioxide layer having a thickness of about 3 Angstroms; and
    a polysilicon layer formed upon said silicon dioxide layer.

8. A structure as recited in claim 7, wherein said monocrystalline silicon layer, said oxide layer, and said polysilicon layer form a laminate having an average sheet resistance and having a plurality of points thereon, wherein the sheet resistance at each said point is within 10% of said average sheet resistance.

9. A structure as recited in claim 7, wherein said polysilicon layer has a plurality of points thereon and has an average thickness, wherein the thickness at each said point on said polysilicon layer is within 7% of the average thickness of said polysilicon layer.

10. A structure formed over a semiconductor substrate, said structure comprising:
    a first polysilicon layer positioned over said semiconductor substrate, said first polysilicon layer having an exposed top surface, said first polysilicon layer being doped with dopants at a concentration in a range from about $5 \times 10^{19}$ atoms/cm$^3$ to about $1 \times 10^{21}$ atoms/cm$^3$;
    a contact opening formed through said first polysilicon layer, said contact opening being defined in part by both of a contact surface on said semiconductor substrate and a sidewall surface of said first polysilicon layer;
    a silicon dioxide layer having a substantially uniform thickness in a range from about 1 Angstrom to about 20 Angstroms formed on each of:
        said contact surface;
        said exposed top surface of said first polysilicon layer; and
        said sidewall surface of said first polysilicon layer; and
    a second polysilicon layer positioned upon said silicon dioxide layer, said second polysilicon layer covering said contact surface and said sidewall surface.

11. A structure as recited in claim 10, wherein said second polysilicon layer is substantially undoped.

12. A structure as recited in claim 7, wherein said monocrystalline silicon layer is doped with dopants at a concentration in a range from about $5 \times 10^{19}$ atoms/cm$^3$ to about $1 \times 10^{21}$ atoms/cm$^3$.

13. A structure as recited in claim 10, further comprising:
    an electrically conductive layer positioned upon said semiconductor substrate; and
    an electrically insulative layer formed upon said electrically conductive layer and positioned under and in contact with said first polysilicon layer, said electrically insulative layer being substantially composed of silicon dioxide.

14. A structure as recited in claim 10, wherein said structure has an average sheet resistance, said structure further having a sheet resistance at each point of a plurality of points on said structure, wherein the sheet resistance at each said point is within 10% of said average sheet resistance of said structure.

15. A structure as recited in claim 10, wherein said second polysilicon layer has an average thickness and has a thickness at each point of a plurality of points on said second polysilicon layer, wherein the thickness at each said point is within 7% of the average thickness of said second polysilicon layer.

16. A structure formed over a semiconductor substrate, said structure comprising:
    a first layer of silicon-containing material positioned over said semiconductor substrate, said first layer of silicon-containing material having an exposed top surface;
    a contact opening formed through said first layer of silicon-containing material, said contact opening being defined in part by both of a contact surface on said semiconductor substrate and a sidewall surface of said first layer of silicon-containing material;

a silicon dioxide layer having a substantially uniform thickness in a range from about one molecule to about nine molecules of silicon dioxide formed on each of:
said contact surface;
said exposed top surface of said first layer of silicon-containing material; and
said sidewall surface of said first layer of silicon-containing material; and
a second layer of silicon-containing material positioned upon said oxide layer, said second layer of silicon-containing material covering said contact surface and said sidewall surface.

17. A structure as recited in claim 16, further comprising:
an electrically conductive layer positioned upon said semiconductor substrate; and
an electrically insulative layer formed upon said electrically conductive layer and positioned under and in contact with said first layer of silicon-containing material, said electrically insulative layer being substantially composed of silicon dioxide.

18. A structure as recited in claim 16, wherein said structure has an average sheet resistance, said structure further having a sheet resistance at each point of a plurality of points on said structure, wherein the sheet resistance at each said point is within 10% of said average sheet resistance of said structure.

19. A structure as recited in claim 16, wherein said second layer of silicon-containing material has an average thickness and has a thickness at each point of a plurality of points on said second layer of silicon-containing material, wherein the thickness at each said point is within 7% of the average thickness of said second layer of silicon-containing material.

20. A structure as recited in claim 16, wherein said first layer of silicon-containing material is substantially composed of a material selected from the group consisting of monocrystalline silicon, polysilicon, hemispherical grain silicon, spherical grain silicon, and amorphous silicon.

21. A structure as recited in claim 16, wherein said second layer of silicon-containing material is substantially composed of a material selected from the group consisting of monocrystalline silicon, polysilicon, hemispherical grain silicon, spherical grain silicon, and amorphous silicon.

22. A structure as recited in claim 16, wherein said first layer of silicon-containing material is doped with dopants at a concentration in a range from about $5 \times 10^{19}$ atoms/cm$^3$ to about $1 \times 10^{21}$ atoms/cm$^3$.

* * * * *

UNITED STATES PATENT AND TRADEMARK OFFICE
CERTIFICATE OF CORRECTION

PATENT NO. : 5,989,718
DATED : Nov. 23, 1999
INVENTOR(S) : Keith W. Smith; Charles E. Carver; Clarence J. Higdon It is certified that error appears in the above-identified patent and that said Letters Patent is hereby corrected as shown below:

Col. 1, line 60, after "as" insert --a--

Col. 4, line 27, after "substrate" change "14" to --12--

Col. 4, line 29, after "(not shown)" insert a period

Col. 4, line 64, change "and" to --to--

Col. 5, line 56, after "and" delete "a"

Signed and Sealed this

Twenty-seventh Day of March, 2001

NICHOLAS P. GODICI

*Attest:*

*Attesting Officer*  *Acting Director of the United States Patent and Trademark Office*